(12) United States Patent
Lin et al.

(10) Patent No.: US 11,508,452 B2
(45) Date of Patent: Nov. 22, 2022

(54) CIRCUIT AND ASSOCIATED CHIP

(71) Applicant: REALTEK SEMICONDUCTOR CORPORATION, Hsinchu (TW)

(72) Inventors: Sheng-Lin Lin, Hsinchu (TW); Shih-Chieh Lin, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/494,646

(22) Filed: Oct. 5, 2021

(65) Prior Publication Data

US 2022/0130481 A1    Apr. 28, 2022

(30) Foreign Application Priority Data

Oct. 27, 2020  (TW) ................... 109137298

(51) Int. Cl.
| | | |
|---|---|---|
| *G11C 29/02* | (2006.01) | |
| *G01R 31/3185* | (2006.01) | |
| *G11C 29/30* | (2006.01) | |
| *G11C 29/14* | (2006.01) | |
| *G11C 29/32* | (2006.01) | |
| *G11C 29/12* | (2006.01) | |
| *G11C 29/56* | (2006.01) | |

(52) U.S. Cl.
CPC .... *G11C 29/025* (2013.01); *G01R 31/318541* (2013.01); *G11C 29/1201* (2013.01); *G11C 29/14* (2013.01); *G11C 29/30* (2013.01); *G11C 29/32* (2013.01); *G11C 29/56008* (2013.01); *G11C 2029/3202* (2013.01)

(58) Field of Classification Search
CPC ... G11C 29/025; G11C 29/1201; G11C 29/14; G11C 29/30; G11C 29/32; G11C 29/56008; G11C 2029/3202; G01R 31/318541

See application file for complete search history.

(56) References Cited

U.S. PATENT DOCUMENTS

| | | | |
|---|---|---|---|
| 7,237,164 B1* | 6/2007 | Katchmart | G11C 29/32 |
| | | | 714/724 |
| 2009/0044064 A1* | 2/2009 | Sudo | G01R 31/318536 |
| | | | 714/729 |
| 2015/0318860 A1* | 11/2015 | Wang | H03L 7/093 |
| | | | 327/157 |

OTHER PUBLICATIONS

Wang et al, "An Efficient Unknown Blocking Scheme for Low Control Data Volume and High Observability," in IEEE Transactions on Computer-Aided Design of Integrated Circuits and Systems, vol. 27, No. 11, pp. 2039-2052, Nov. 2008. (Year: 2008).*

* cited by examiner

*Primary Examiner* — Cynthia Britt
(74) *Attorney, Agent, or Firm* — WPAT, P.C., Intellectual Property Attorneys; Anthony King (57) ABSTRACT

The present application provides a circuit and an associated chip. The circuit is coupled to a memory. The circuit includes: a first scan flip-flop (FF), being a previous-stage scan FF of an input terminal of the memory and having an output terminal coupled to an input terminal of the memory; and a second scan FF, being a next-stage scan FF of an output terminal of the memory and having an input terminal coupled to an output terminal of the memory; wherein a scan mode of the circuit has a load phase and a capture phase, during the capture phase, data output from the output terminal of the first scan FF loops back to a data input terminal of the first scan FF via a first loop, and the first loop is free from passing through the second scan FF.

19 Claims, 9 Drawing Sheets

CIRCUIT AND ASSOCIATED CHIP

CROSS REFERENCE TO RELATED APPLICATIONS

This application claims priority of Taiwan application No. 109137298 filed on Oct. 27, 2020, which is incorporated by reference in its entirety.

TECHNICAL FIELD

The present application relates to a circuit; in particular, to a circuit coupled to a memory and not using a bypass circuit between the front-stage and back-stage of the memory, and a related chip.

BACKGROUND

For circuits including a memory is subjected to a scan test, the scan test does not cover the part of the memory. To cover as much as possible of the front-stage circuit and back-stage circuit of the memory in the scan test, it is necessary to pay special attention during the design. However, when the circuit clock is fast and the amount of memories in the circuit is large, it will greatly increase the difficulty of implementing the above-mentioned design.

SUMMARY OF THE INVENTION

One embodiment of the present application discloses a circuit, which is coupled to a memory, wherein the circuit includes a plurality of scan flip-flops (FFs), each having a data input terminal, a scan input terminal, a clock input terminal, a scan enabling terminal and an output terminal, wherein when the scan enabling terminal receives the first voltage level, data received by the data input terminal is output from the output terminal according to a first clock received by the clock input terminal; when the scan enabling terminal receives a second voltage level, the data received by the scan input terminal is output from the output terminal according to the second clock received by the clock input terminal. Each of the plurality of scan FFs includes: a first scan FF, being a previous-stage scan FF of the input terminal of the memory, wherein the output terminal thereof is coupled to the input terminal of the memory; and a second scan FF, being a next-stage scan FF of the output terminal of the memory, wherein the input terminal thereof is coupled to the output terminal the memory. When under a scan mode, the circuit has a load phase and a capture phase; during the load phase, the respective scan enabling terminal of the plurality of scan FFs receives a second voltage level; during the capture phase, the respective scan enabling terminal of the plurality of scan FFs receives a first voltage level; during the load phase, the data output by the output terminal of the first scan FF arrives at the scan input terminal of the second scan FF via a load path; and during the capture phase, the data output by the output terminal of the first scan FF loops backs to the data input terminal of the first scan FF via a first loop, and the first loop is free from passing through the second scan FF.

The present application discloses a chip, which includes the above-mentioned circuit and a memory.

The above-mentioned circuit and related chip can reduce the difficulties in implementing the circuits having a memory.

DETAILED DESCRIPTION

Figure 1:
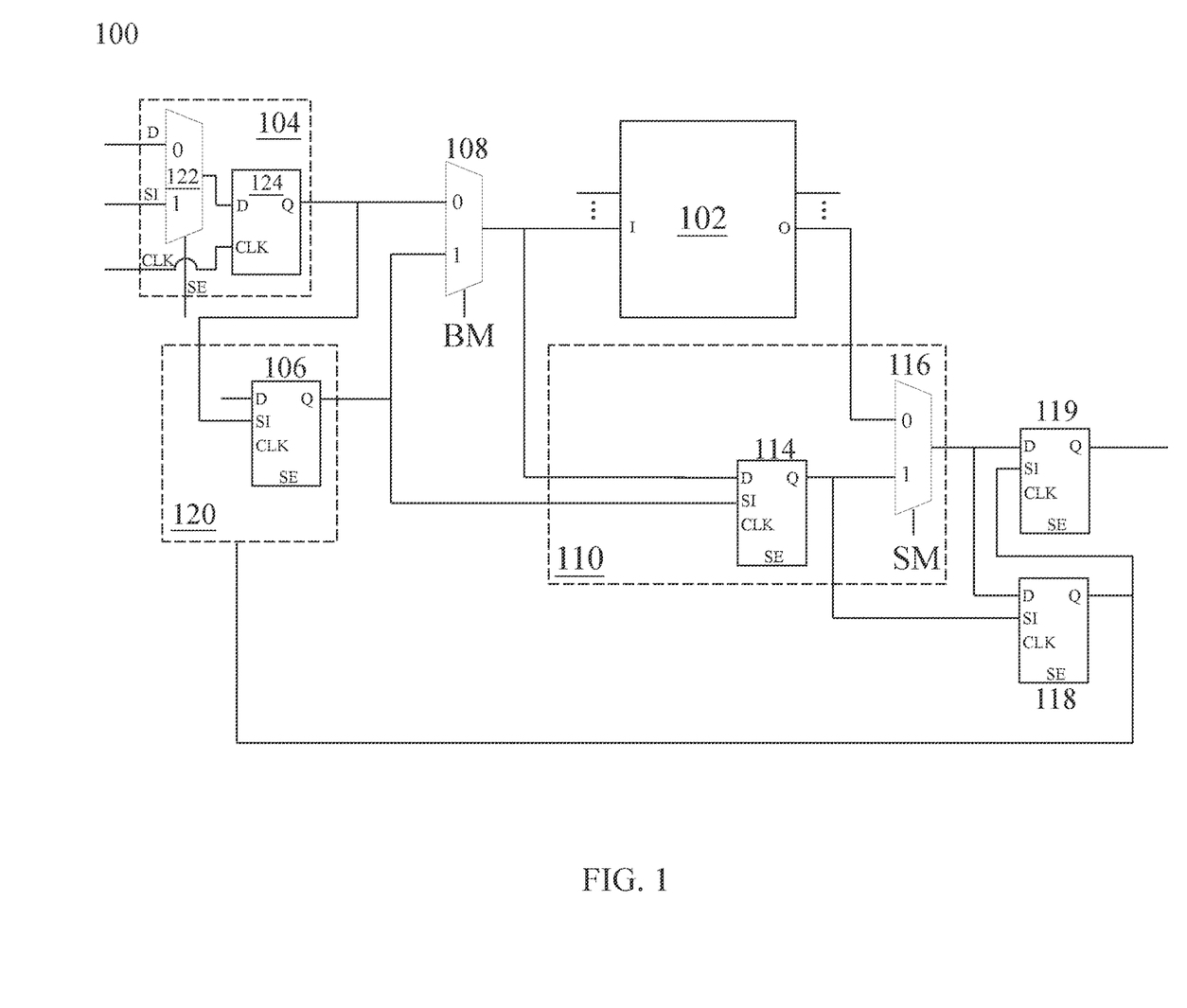
FIG. 1 is a schematic diagram illustrating a comparative example of the present application.

FIG. 1 is a schematic diagram illustrating a comparative embodiment according to the present application. In this example, the circuit 100 includes a memory 102, wherein a plurality of input terminals of the memory 102 may include a plurality of data input terminals, a plurality of address input terminals and a plurality of control input terminals, and the input terminal I of the memory 102 described herein can be any one of the foregoing. A plurality of output terminal of the memory 102 may include a plurality of data output terminals, and the output terminal O of the memory 102 described herein can be any one of the foregoing. It should be noted that, the circuit 100 can be applied to all input terminals and output terminals of the memory 102; however, the drawing does not show such application for the sake of brevity.

The circuit 100 includes scan FFs 104, 106, 114, 118 and 119, each having a data input terminal D, a scan input terminal SI, a clock input terminal CLK, a scan enabling terminal SE and an output terminal Q, wherein when the scan enabling terminal SE receives a low voltage level, the data received by the data input terminal D is output from the output terminal Q according to a first clock received by the clock input terminal CLK; when the scan enabling terminal SE receives a high voltage level, the data received by the scan input terminal SI is output from the output terminal Q according to the second clock received by the clock input terminal CLK. The implementation of all scan FFs according to the present application is the same as the scan FF 104 shown in FIG. 1; i.e., including a multiplexer 122 and a general flip-flop 124; however, the present application is not limited thereto.

The circuit 100 further includes a built-in self-test circuit 120, which is configured to generate a test signal that reaches the input terminal I of the memory 102 via a multiplexer 108; an output signal of the output terminal O of the memory 102 loops backs to the built-in self-test circuit 120 via the multiplexer 116 and the scan FF 118, and is compared with a pre-defined result to see if they are the same, so as to complete the self-test operation of the memory 102. Specifically, the circuit 100 can operates in a self-test operation or a normal operation under a non-scan mode; during the self-test operation, the control signal BM transmits the output of the output-stage scan FF 104 of the built-in self-test circuit 120 to the memory 102; whereas during the normal operation, the BM transmits the output of the scan FF 104 to the memory 102.

The scan FF 104 and the scan FF 106 are previous-stage scan FFs of the input terminal I of the memory 102; the scan FF 118 and the scan FF 119 are next-stage scan FFs of the output terminal O of the memory 102. Since the memory 102 is not covered in the scope of the scan test, under a scan mode, the present comparative example uses a bypass circuit 110 to connect the previous-stage scan FF of the input terminal I of the memory 102 and the next-stage scan FF of the output terminal O. In other words, the bypass circuit 110 is only used during the scan mode.

Figure 2:
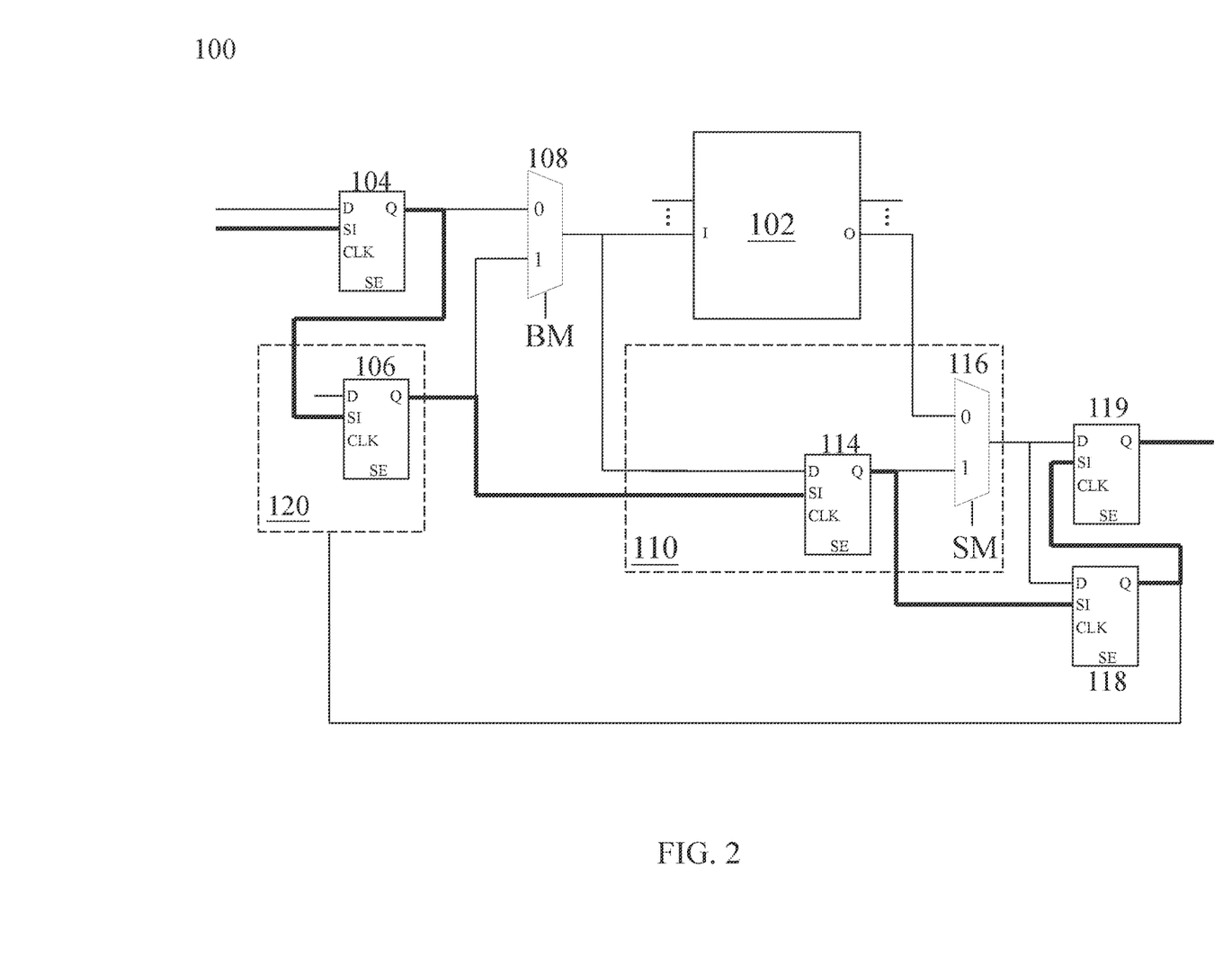
FIG. 2 is a schematic diagram showing the signal transmission of the circuit shown in FIG. 1 during a load phase of the scan mode.

The scan mode includes the following three phases: a load phase, a capture phase and an unload phase. During the scan mode, when the control signal SM is high voltage level, it controls the multiplexer 116 to transmit the output of the scan FF 114 to the scan FFs 118, 119. FIG. 2 is a schematic diagram showing the signal transmission of the circuit 100 during a load phase of the scan mode. In this example, the respective scan enabling terminal SE of scan FFs 104, 106, 114, 118 and 119 is set at high voltage level, so that when a test signal is fed in from a test equipment external to the chip where the circuit 100 locates, the test signal is transmitted to the scan FFs 104, 106, 114, 118 and 119 along a load path (bold lines in the drawing). It should be noted that the connections shown in FIG. 2 are illustrative, and in reality, the load path may pass through the scan FFs in a different order, or the scan FFs 104, 106, 114, 118 and 119 may belong to different load paths.

Figure 3:
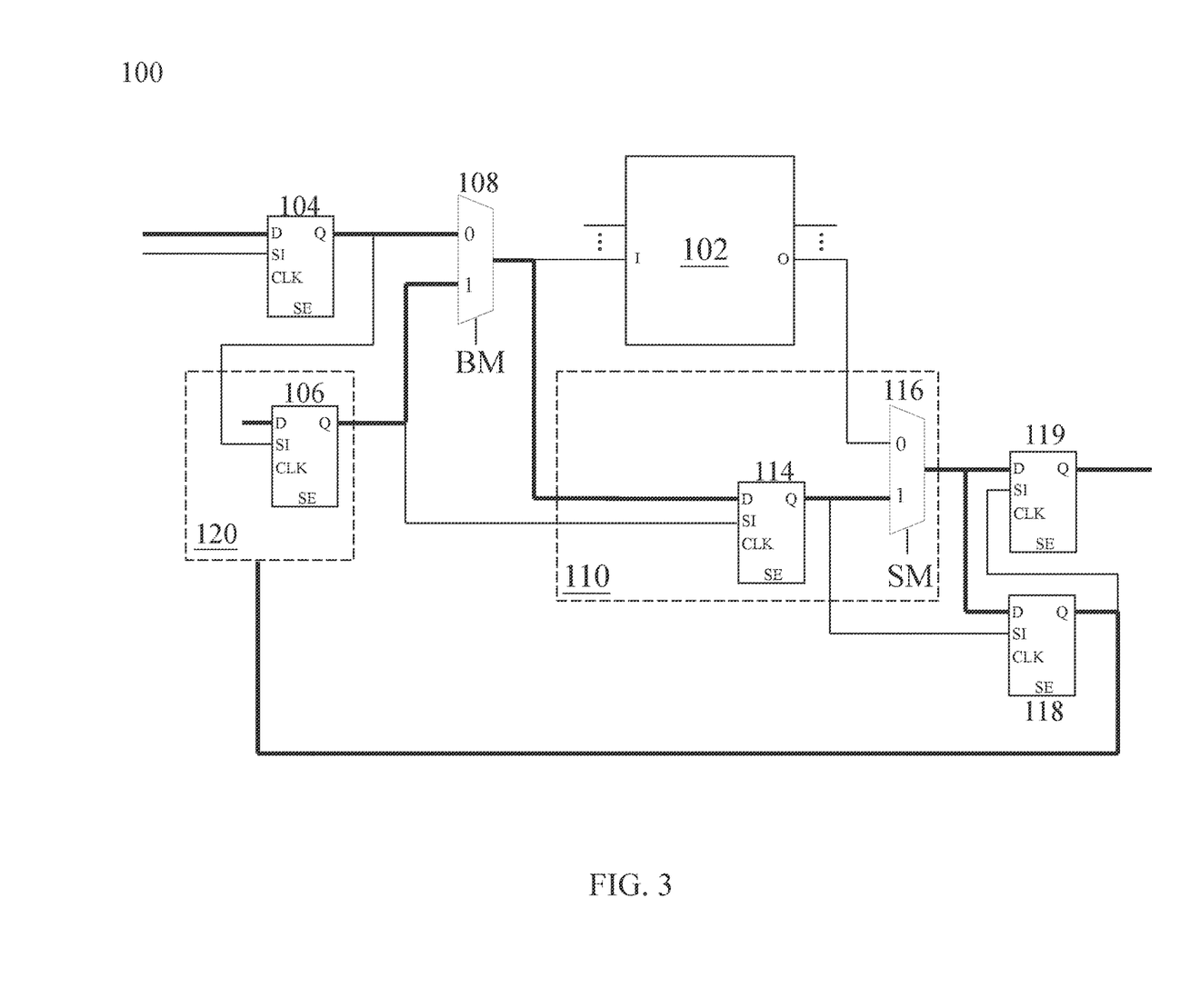
FIG. 3 is a schematic diagram showing the signal transmission of the circuit shown in FIG. 1 during a capture phase of the scan mode.

FIG. 3 is a schematic diagram showing the signal transmission of the circuit 100 during a capture phase of the scan mode. In this example, the respective scan enabling terminal SE of scan FFs 104, 106, 114, 118 and 119 are set at low voltage level, so that the test signal loaded into the scan FFs 104, 106, 114, 118 and 119 are continuously sent to the next-stage FF along the bold line shown in FIG. 3; in the case where the control signal BM is high voltage level, the data output by the output terminal Q of the scan FF 106 loops backs to the built-in self-test circuit 120 via the multiplexer 108, the scan FF 114, the multiplexer 116 and the scan FF 118, thereby forming a loop; in the case where the control signal BM is low voltage level, the data output by the output terminal Q of the scan FF 104 loops backs to the built-in self-test circuit 120 via the multiplexer 108, the scan FF 114, the multiplexer 116 and the scan FF 118, thereby forming a loop. After a pre-determined period passes, the circuit 100 enters the unload phase (same as FIG. 2), and the signals in the scan FFs 104, 106, 114, 118 and 119 are fed to the test equipment to be compared with a pre-determined result.

To reflect real world situations, during the capture phase, scan FFs 104, 106, 114, 118 and 119 operates at a first clock, which is the same as the clock used for the normal operation. On the other hand, during the load phase and the unload phase, scan FFs 104, 106, 114, 118 and 119 operates at a second clock, which is supplied from the test equipment, and the frequency of the second clock is much lower than that of the first clock as a restraint of the machine's speed. Since in the circuit layout, the memory 102 often occupies quite some area, the bypass circuit 110 connecting the front-stage and back-stage of the memory 102 has to span a considerable distance and at the same time satisfies the operation frequency of the capture phase, which makes it somewhat difficult for the routing of the circuit layout.

Figure 4:
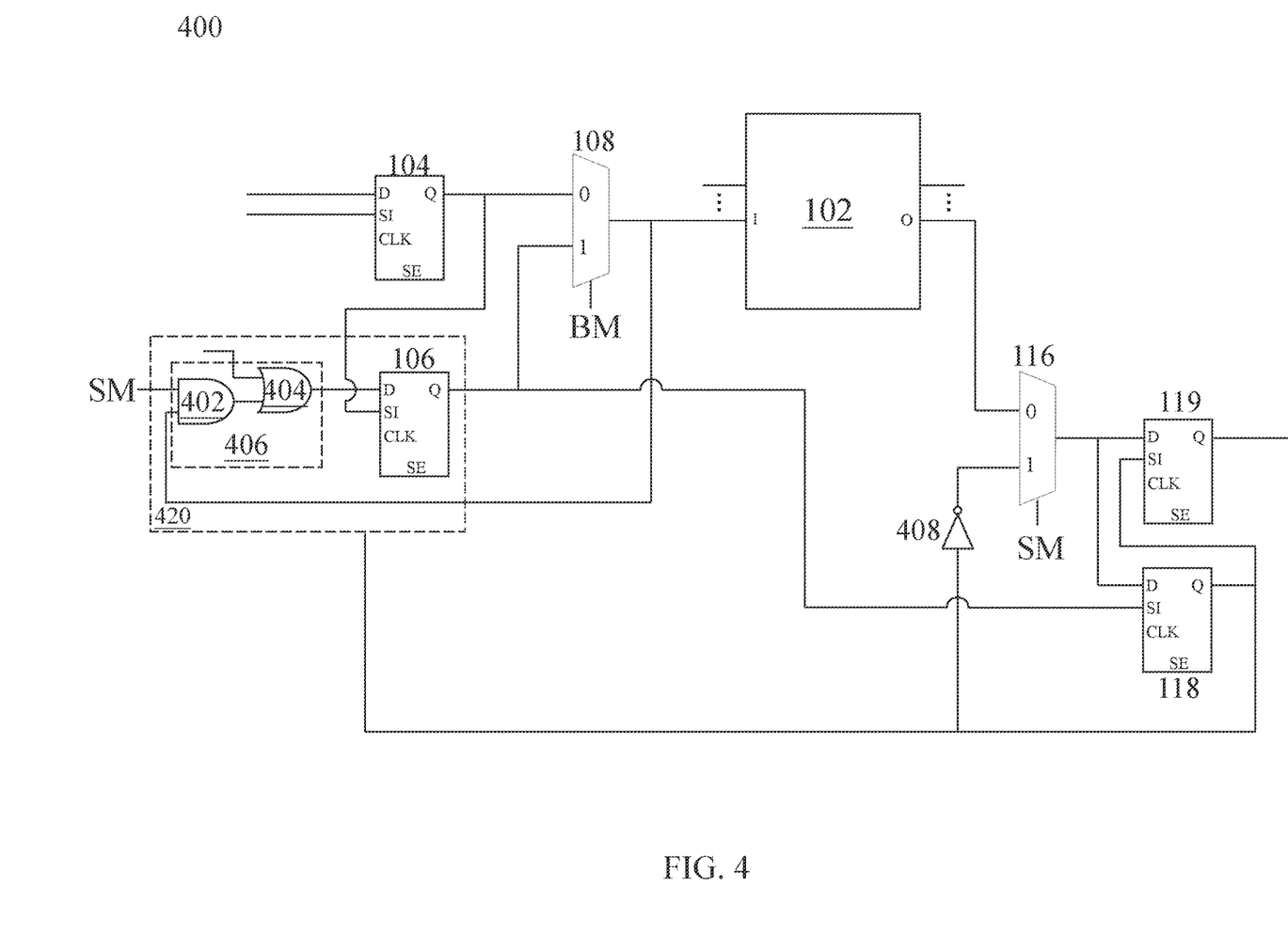
FIG. 4 is a schematic diagram illustrating a circuit according to the first embodiment of the present application.
Figure 5:
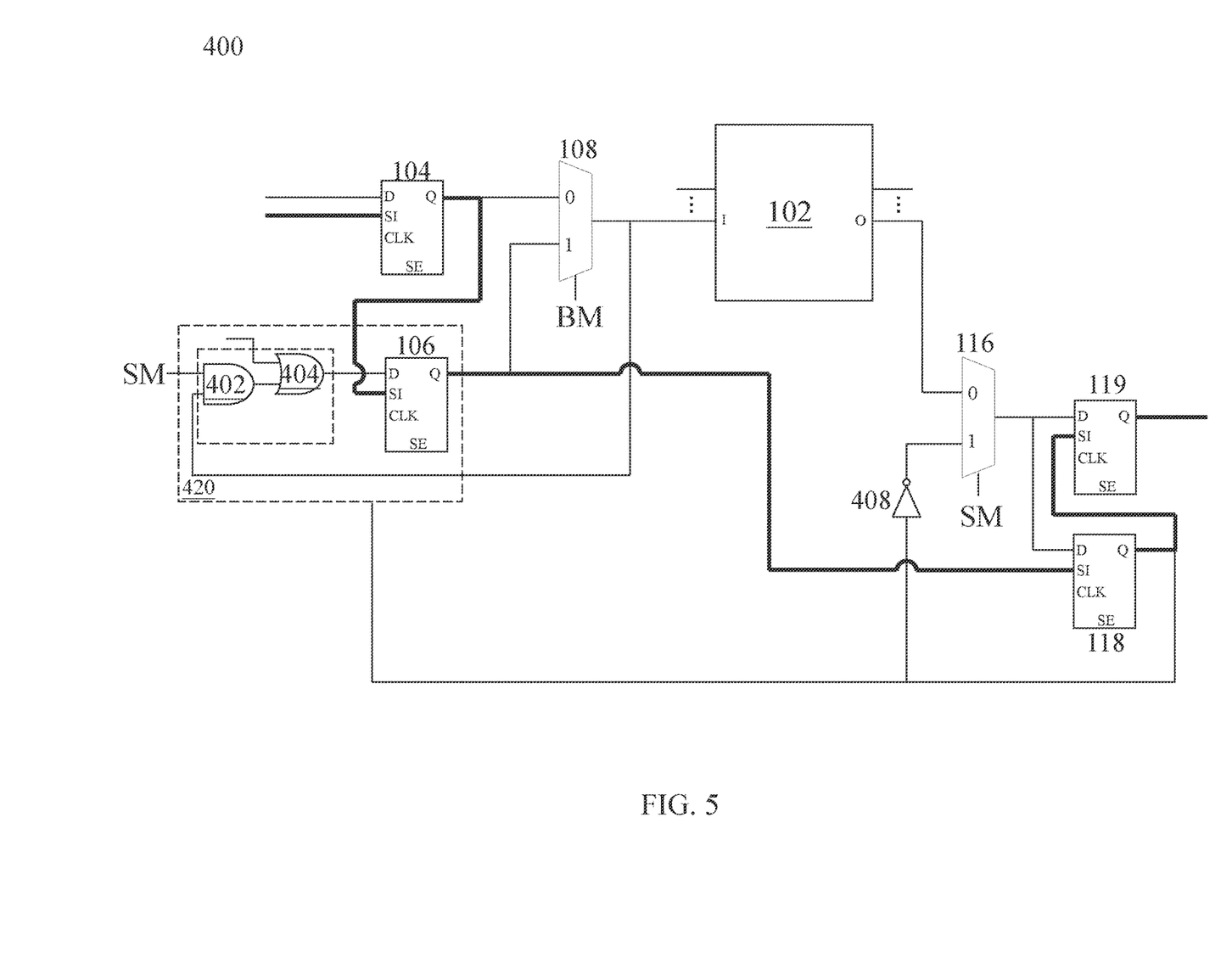
FIG. 5 is a schematic diagram showing the signal transmission of the circuit shown in FIG. 4 during a load phase of the scan mode.

FIG. 4 is a schematic diagram illustrating a circuit according to the first embodiment of the present application. The circuit 400 is disposed in a chip, and the framework and operations thereof is similar to that of the circuit 100 except that the circuit 400 does not include the bypass circuit connecting the previous-stage scan FF of the input terminal I of the memory 102 and the next-stage scan FF of the output terminal O and the connection between a built-in self-test circuit 420 and the circuit 400 is adjusted slightly. FIG. 5 is a schematic diagram showing the signal transmission of the circuit 400 during a load phase of the scan mode; the load path shown in FIG. 5 is the same as or similar to that shown in FIG. 2; the reason for that is the operation frequency in the load phase is lower and hence would not cause the difficulties in routing, as discussed above. Removing the bypass circuit would give rise to greater differences during the capture phase.

Figure 6:
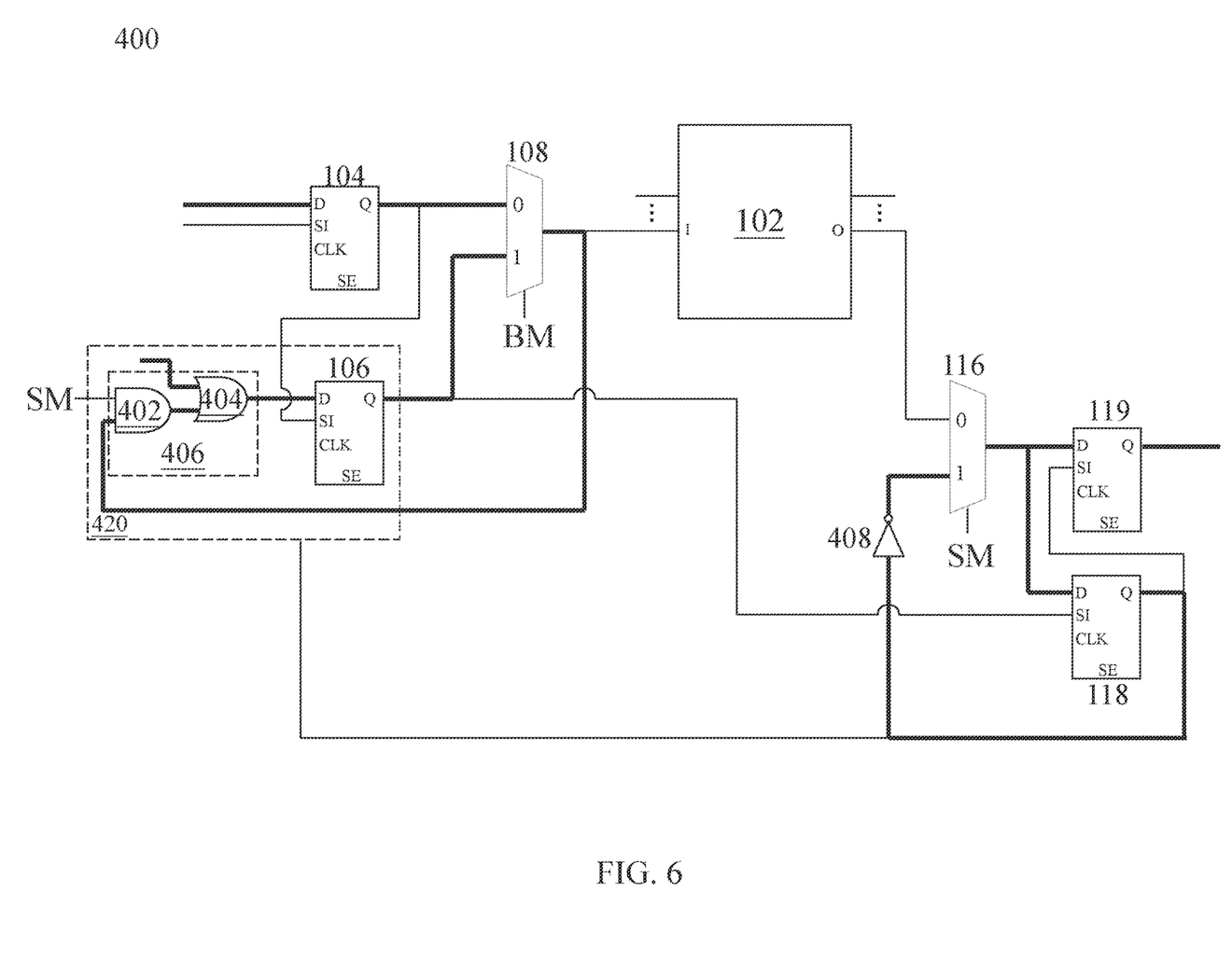
FIG. 6 is a schematic diagram showing the signal transmission of the circuit shown in FIG. 4 during a capture phase of the scan mode.

FIG. 6 is a schematic diagram showing the signal transmission of the circuit 400 during a capture phase of the scan mode. Specifically, when the circuit 400 operates during the capture phase, when the control signal BM is high voltage level, the data output by the output terminal Q of the scan FF 106 loops backs to the data input terminal D of the scan FF 106 via the multiplexer 108 and the multiplexer 406, thereby forming a loop that does not pass through the scan FF 118; when the control signal BM is low voltage level, the data output by the output terminal Q of the scan FF 104 reaches the data input terminal D of the scan FF 106 via the multiplexer 108 and multiplexer 406, thereby forming a loop that does not pass through the scan FF 118. The data output by the output terminal Q of the scan FF 118 loops backs to the data input terminal D of the scan FF 118 via an NOT gate 408 and the multiplexer 116, thereby forming a loop that does not pass through scan FFs 104 or 106; the data output by the output terminal Q of the scan FF 119 does not pass through the loop of the scan FF 104 or 106. In other words, the previous-stage scan FFs 104, 106 of the input terminal I and the next-stage the scan FFs 118, 119 of the output terminal O are in different loops, and the data therein will not be inter-transmitted; also, during the capture phase, the distances that the loops of the circuit 400 pass through are all shorter than the loops of the circuit 100 during the capture phase; therefore, it is feasible to decrease the complexity in routing so that the area of the circuit 400 is smaller than the area of the circuit 100.

In this example, the NOT gate 408 is used to toggle signals during the capture phase so as to increase the test coverage, and it can be replaced with other logics. The implementation of the multiplexer 406 is shown in the drawings; however, the present application is not limited thereto; including an AND gate 402 and an OR gate 404, wherein one of the input terminals of the AND gate 402 is coupled to the output terminal of the multiplexer 108, and the other input terminal of the AND gate 402 receives the control signal SM; the output terminal of the AND gate 402 is coupled to one of the input terminals of the OR gate 404, and the output terminal of the OR gate 404 is coupled to the data input terminal D of the scan FF 106. The implementation of the multiplexer 406 is also applicable to the implementation of the multiplexers 108 and 116.

Figure 7:
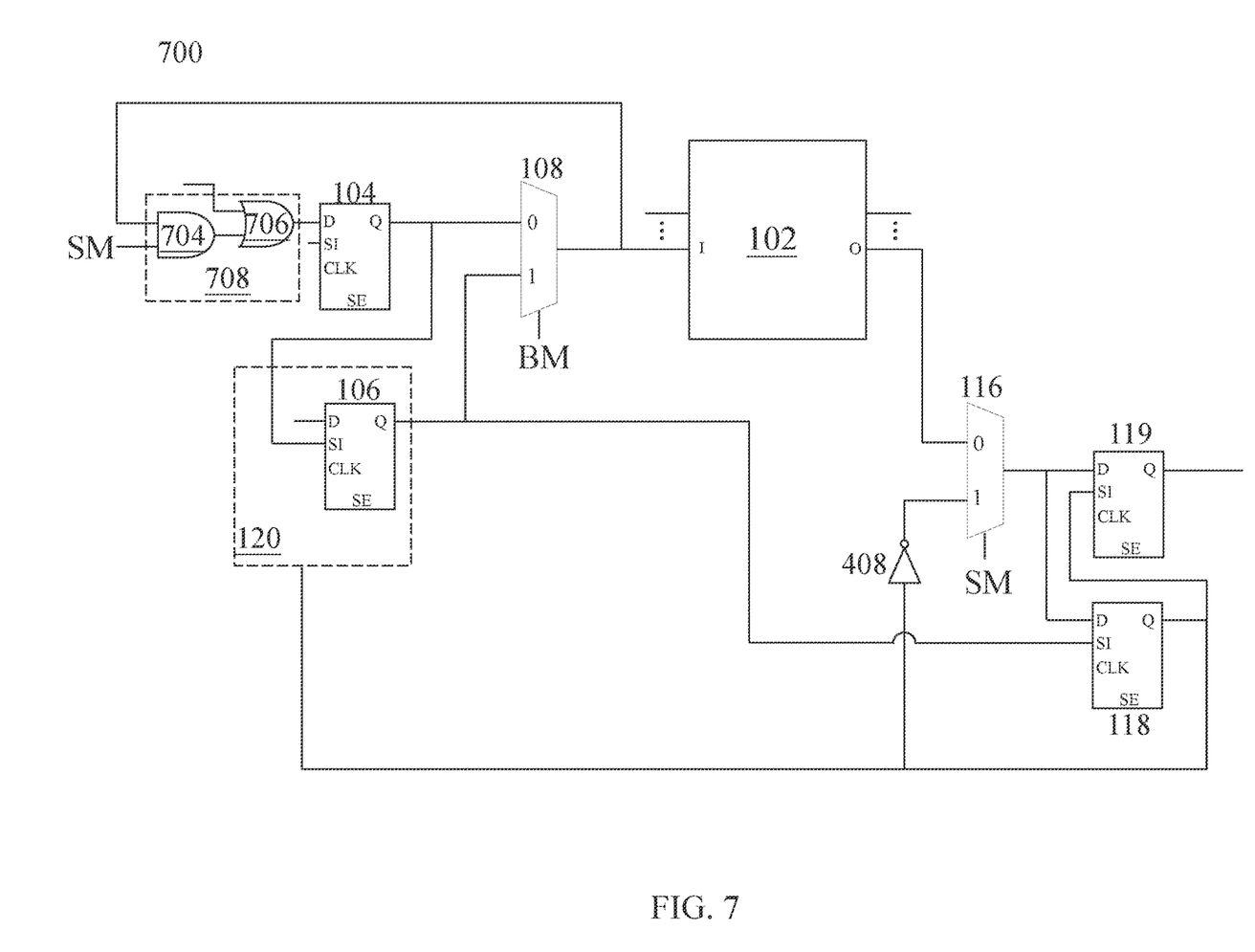
FIG. 7 is a schematic diagram illustrating a circuit according to the second embodiment of the present application.
Figure 8:
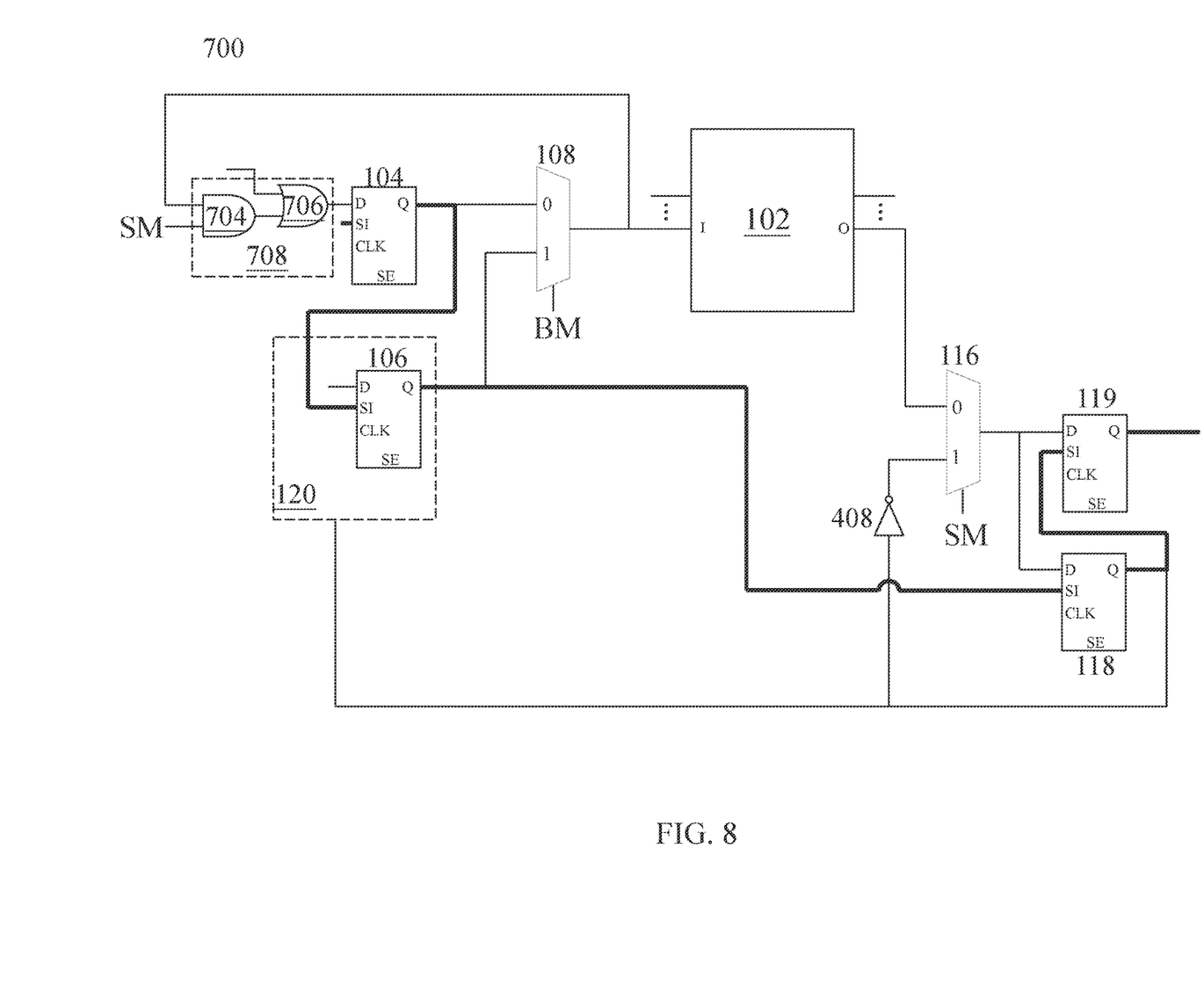
FIG. 8 is a schematic diagram showing the signal transmission of the circuit shown in FIG. 7 during a load phase of the scan mode.

FIG. 7 is a schematic diagram illustrating a circuit according to the second embodiment of the present application. The circuit 700 is disposed in a chip, and the framework and operations thereof is similar to that of the circuit 400 except that the loops formed in capture phase are slightly different. FIG. 8 is a schematic diagram showing the signal transmission of the circuit 700 during a load phase of the scan mode; the load path shown in FIG. 8 is the same as or similar to that shown in FIG. 2 and FIG. 5.

Figure 9:
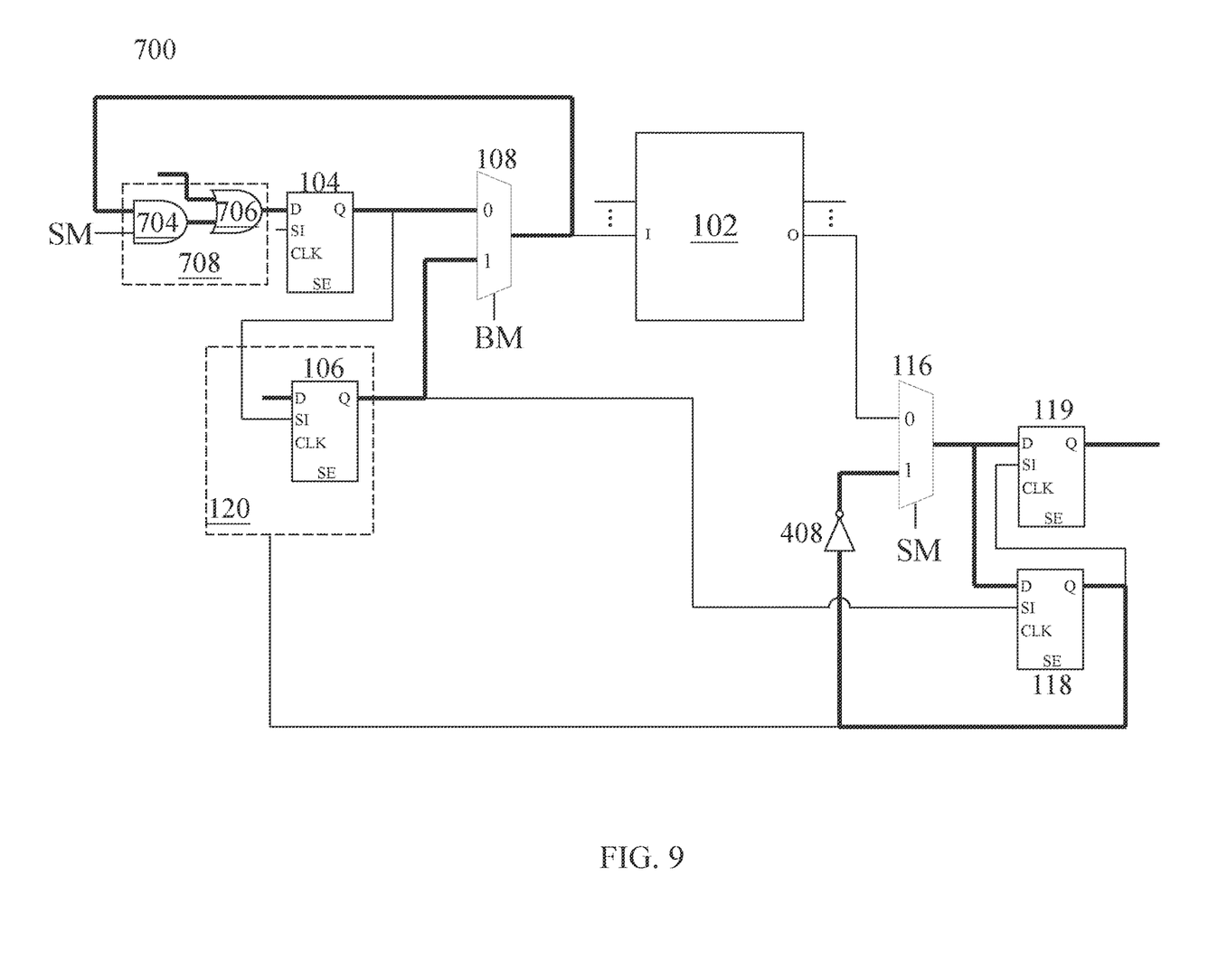
FIG. 9 is a schematic diagram showing the signal transmission of the circuit shown in FIG. 7 during a capture phase of the scan mode.

FIG. 9 is a schematic diagram showing the signal transmission of the circuit 700 during a capture phase of the scan mode. Specifically, when the circuit 700 operates during the capture phase, when the control signal BM is high voltage level, the data output by the output terminal Q of the scan FF 106 reaches the data input terminal D of the scan FF 106 via the multiplexer 108 and the multiplexer 708, thereby forming a loop that does not pass through the scan FF 118; when the control signal BM is low voltage level, the data output by the output terminal Q of the scan FF 104 loops backs to the data input terminal D of the scan FF 104 via the multiplexer 108 and multiplexer 708, thereby forming a loop that does not pass through the scan FF 118. The loops for the scan FFs 118, 119 are the same as those shown in FIG. 6.

The implementation of the multiplexer 708 may be the same as the implementation of the multiplexer 406; however, the present application is not limited thereto; including an AND gate 704 and an OR gate 706, wherein one of the input terminals of the AND gate 704 is coupled to the output terminal of the multiplexer 108, and the other input terminal of the AND gate 704 receives the control signal SM; the output terminal of the AND gate 704 is coupled to one of the input terminals of the OR gate 706, and the output terminal of the OR gate 706 is coupled to the data input terminal D of the scan FF 104. The implementation of the multiplexer 708 is also applicable to the implementation of the multiplexers 108 and 116.

The foregoing outlines features of several embodiments so that those skilled in the art may better understand various aspects of the present disclosure. Those skilled in the art should appreciate that they may readily use the present disclosure as a basis for designing or modifying other processes and structures for carrying out the same purposes and/or achieving the same advantages of embodiments introduced herein. It should be understood that the steps mentioned in the flowchart of the method of the present application can be adjusted in accordance with the actual needs except for those whose sequences are specifically stated, and can even be executed simultaneously or partially simultaneously. In addition, the above-mentioned modules or method steps can be implemented by hardware, software or firmware according to the designer's needs. Those skilled in the art should also realize that such equivalent embodiments still fall within the spirit and scope of the present disclosure, and they may make various changes, substitutions, and alterations thereto without departing from the spirit and scope of the present disclosure.

What is claimed is:

1. A circuit, coupled to memory, the circuit comprising: a plurality of scan flip-flops (FFs), each having a data input terminal, a scan input terminal, a clock input terminal, a scan enabling terminal and an output terminal, wherein when the scan enabling terminal receives a first voltage level, data received by the data input terminal is output from the output terminal according to a first clock received by the clock input terminal, when the scan enabling terminal receives a second voltage level, data received by the scan input terminal is output from the output terminal according to a second clock received by the clock input terminal, and the plurality of scan FFs comprise:

a first scan FF, as a previous-stage scan FF of the input terminal of the memory, wherein the output terminal of the first scan FF is coupled to the input terminal of the memory; and a second scan FF, as a next-stage scan FF of the output terminal of the memory, wherein the input terminal of the second scan FF is coupled to the output terminal of the memory;

wherein, under a scan mode, the circuit has a load phase and a capture phase, wherein during the load phase, the respective scan enabling terminal of the plurality of scan FFs receives the second voltage level, and during the capture phase, the respective scan enabling terminal of the plurality of scan FFs receives the first voltage level;

during the load phase, data output by the output terminal of the first scan FF reaches the scan input terminal of the second scan FF via a load path; and during the capture phase, data output by the output terminal of the first scan FF loops back to the data input terminal of the first scan FF via a first loop, and the first loop is free from passing through the second scan FF.

2. The circuit of claim 1, wherein, under the scan mode, the circuit further has an unload phase, wherein during the unload phase, the respective scan enabling terminal of the plurality of scan FFs receives the second voltage level, and data output by the output terminal of the first scan FF reaches the scan input terminal of the second scan FF via the load path.

3. The circuit of claim 2, wherein during the load phase and the unload phase, data received by the scan input terminal of the first scan FF shifts from the first scan FF to the second scan FF according to the second clock.

4. The circuit of claim 3, wherein data output by the output terminal of the second scan FF loops backs to the data input terminal of the second scan FF via a second loop, and the second loop is free from passing through the first scan FF.

5. The circuit of claim 1, wherein the first clock is faster than the second clock.

6. The circuit of claim 1, wherein the plurality of scan FFs further comprises a third scan FF, and the circuit further comprises:

a first multiplexer, configured to selectively couple the output terminal of the first scan FF or an output terminal of the third scan FF to the input terminal of the memory.

7. The circuit of claim 6, wherein the first multiplexer outputs the output of the first scan FF or the output of the third scan according to the first control signal.

8. The circuit of claim 7, wherein during the capture phase, the first loop passes through the first multiplexer.

9. The circuit of claim 8, wherein the first scan FF locates in a built-in self-test circuit, and the built-in self-test circuit is configured to test the memory.

10. The circuit of claim 8, further comprising a built-in self-test circuit, configured to test the memory, wherein the third scan FF locates in the built-in self-test circuit.

11. The circuit of claim 8, wherein during the load phase, the load path passes through the third scan FF.

12. The circuit of claim 8, wherein during the capture phase, data output by the output terminal of the third scan FF reaches the data input terminal of the first scan FF via the first multiplexer.

13. The circuit of claim 8, further comprising a second multiplexer, coupled between the data input terminal of the first scan FF and the output terminal of the first multiplexer, wherein during the capture phase, the first loop passes through the second multiplexer.

14. The circuit of claim 13, wherein the second multiplexer determines whether to output the output of the first multiplexer according to the second control signal.

15. The circuit of claim 14, wherein the second multiplexer comprises an AND gate and an OR gate, wherein the OR gate is coupled between the AND gate and the first scan FF.

16. The circuit of claim 14, wherein the circuit further comprises:
   a third multiplexer, configured to selectively couple the output terminal of the memory or the output terminal of the second scan FF to the data output terminal of the second scan FF.

17. The circuit of claim 16, wherein the third multiplexer selectively outputs the output of the output terminal of the memory or the output of the second scan FF according to the second control signal.

18. The circuit of claim 17, wherein during the capture phase, the second loop passes through the third multiplexer.

19. The circuit of claim 18, further comprising a NOT gate, coupled between the input terminal of the third multiplexer and the output terminal of the second scan FF.

* * * * *